(12) United States Patent
Hayes

(10) Patent No.: US 7,098,744 B2
(45) Date of Patent: Aug. 29, 2006

(54) METHOD AND APPARATUS FOR GENERATING TWO FREQUENCIES HAVING A FREQUENCY SEPARATION EQUAL TO THE ATOMIC FREQUENCY OF AN ATOMIC SPECIES

(75) Inventor: Robert R. Hayes, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 324 days.

(21) Appl. No.: 10/714,346

(22) Filed: Nov. 14, 2003

(65) Prior Publication Data

US 2004/0120368 A1   Jun. 24, 2004

Related U.S. Application Data

(60) Provisional application No. 60/434,704, filed on Dec. 18, 2002.

(51) Int. Cl.
*H03L 7/26* (2006.01)
(52) U.S. Cl. .......................................................... 331/3
(58) Field of Classification Search ................ 331/3, 331/94.1
See application file for complete search history.

(56) References Cited

U.S. PATENT DOCUMENTS

| | | | |
|---|---|---|---|
| 5,517,157 A | 5/1996 | English | 331/94.1 |
| 5,657,340 A | 8/1997 | Camparo et al. | 372/69 |
| 6,303,928 B1 | 10/2001 | Buell et al. | 250/251 |
| 6,320,472 B1 * | 11/2001 | Vanier | 331/94.1 |
| 6,359,916 B1 | 3/2002 | Zhu | 372/32 |
| 2002/0175767 A1 | 11/2002 | Kitching et al. | 331/3 |

OTHER PUBLICATIONS

Huang, X., Seeds, A.J., Roberts, J.S., and Knight, A.P., "Monolithically Integrated Quantum-Confined Stark Effect Tuned Laser with Uniform Frequency Modulation Response," IEEE Photonics Technology Letters, vol. 10, pp. 1697-1699 (1998).
Kitching, J., Knappe, S., Vukicevic, N., Hopllberg, L., Wynands, R., Wiedmann, W., "A Microwave Frequency based on VCSEL-Driven Dark Line Resonances in Cs Vapor," IEEE Trans. On Instruments and Measurements, vol. 49, pp. 1313-1317 (2000).
"Compact Atomic Clocks" INTERNET: <http://www.boulder.mist.gov/timefreq/ofm/smallclock/index/htm 28 pages.

* cited by examiner

*Primary Examiner*—David Mis
(74) *Attorney, Agent, or Firm*—Ladas & Parry LLP

(57) ABSTRACT

A method and apparatus that can generate two frequencies separated by the atomic hyperfine frequency separation needed to excite resonance in a Cs atom. In the present invention a coherent light source is frequency modulated with a modulation frequency having a sine wave to generate a lightwave. The lightwave comprises the two coherent optical fields having the frequency separation needed to excite resonance in the Cs atom. The modulation frequency can then be adjusted in order to fine-tune the frequency separation of the two coherent optical fields. The present invention also provides a method for localizing about 50% of the power in the lightwave at the two coherent optical fields by frequency modulating the light source with a square wave.

23 Claims, 5 Drawing Sheets

US 7,098,744 B2

METHOD AND APPARATUS FOR GENERATING TWO FREQUENCIES HAVING A FREQUENCY SEPARATION EQUAL TO THE ATOMIC FREQUENCY OF AN ATOMIC SPECIES

CROSS REFERENCE TO RELATED APPLICATION

The present application is related to and claims the benefit of U.S. Provisional Application No. 60/434,704, filed on Dec. 18, 2002, and entitled "Method and Apparatus for Generating Two Frequencies Having a Frequency Separation Equal to the Atomic frequency of an Atomic Species." The disclosure of U.S. Provisional Application No. 60/434,704 is incorporated by reference herein in its entirety.

BACKGROUND

1. Field

The present invention relates to a method and apparatus for generating a lightwave comprising several frequencies from a fundamental RF frequency. More specifically, the present invention relates to a method for generating a lightwave with at least two frequencies having a frequency separation equal to the atomic hyperfine frequency of an atom.

2. Description of Related Art

Precise timekeeping is important in communications and navigation satellite systems. As a result atomic clocks can play an important role in such systems because of their long-term accuracy in monitoring time. Similarly, timekeeping is critical for the Global Positioning System (GPS), where atomic clocks are deployed on satellites, because small time errors can lead to significant positioning errors. Because these clocks are often deployed on satellite systems, it is also very desirable to reduce the power consumption of the clock.

Atomic clocks are based on transitions between atomic energy levels. In one particular type of clock, cesium (Cs) atoms are exposed to a lightwave having two different frequencies that stimulate two different transitions. These transitions are separated in frequency by the atomic hyperfine frequency of Cs (approximately 9.192 GHz).

The National Institute of Standards and Technology (NIST) teaches one approach for generating two frequencies separated by the atomic hyperfine frequency separation of Cs. In the NIST approach a laser is amplitude modulated with a modulation frequency equal to half of the Cs atomic frequency, about 4.596 GHz. In order to generate the modulation frequency, NIST takes a fundamental frequency that can be easily generated and accurately measured, typically around 100–200 MHz, and uses frequency multipliers, amplifiers, mixers, filters, and dividers to generate the modulation frequency. The modulation frequency is then used to amplitude modulate a laser source.

Amplitude modulating the laser at 4.596 GHz creates a lightwave in the frequency domain, as shown in FIG. 1. The lightwave contains a center frequency $f_0$ which is typically about 352.112 THz (corresponds to a 852 nm wavelength) and a sideband pair having an upper sideband $f_{12}$ and a lower sideband $f_{23}$. It is well known that the upper and lower sidebands produced by amplitude modulating a laser are separated from the center frequency $f_0$ by a frequency equal to the modulation frequency. This results in the upper sideband $f_{12}$ and lower sideband $f_{23}$ having the necessary hyperfine frequency separation $f_{13}$ of 9.192 GHz needed to stimulate Cs atoms.

The NIST approach provides an all-optical atomic clock that does not use the injection of separate microwave signals at the Cs atomic frequency into a microwave excitation cavity, as required by other prior art atomic clocks. A drawback with the NIST approach is that the RF-circuitry needed to generate the modulation frequency requires too much power (5–20W) and space to be used for lower power applications. That is, as noted above, several frequency multipliers, etc. are needed to upconvert the fundamental frequency to the modulation frequency of the amplitude modulated signal.

As a result, there is a need for a method and apparatus which can generate a lightwave or lightwaves having two frequencies separated by the atomic hyperfine frequency of an atom species, without using power consuming RF-circuitry.

SUMMARY

The present invention meets the aforementioned needs by providing a method and apparatus that can generate two frequencies needed to excite resonance in a Cs atom. Although the method and apparatus is described with reference to Cs, it should be understood from the outset that this invention is equally applicable to other atomic species.

In accordance with one aspect of the present invention, a light source is frequency modulated to generate a lightwave. The lightwave contains two coherent optical fields with frequencies that are separated by the atomic hyperfine frequency of Cs. The lightwave is then directed at a plurality of atoms, where the two coherent optical fields excite resonance in the Cs atom. This technique helps eliminate the power consumptive RF circuitry that has previously been needed in order to generate two frequencies needed to excite resonance in a Cs atom. Also, the modulation frequency used can be adjusted in order to fine-tune the two frequencies of the coherent optical fields.

In accordance with another aspect of this invention, about 50% of the energy in the lightwave can be localized at two frequencies of the coherent optical fields separated by the atomic hyperfine frequency of Cs. A square-wave modulation signal is used to frequency modulate the light source. The frequency of the square-wave modulation signal can be adjusted to fine-tune the two frequencies, and the amplitude of the square-wave modulation signal can be adjusted to select the frequencies that receive about 50% of the energy in the lightwave.

DETAILED DESCRIPTION

The present invention will now be described more fully hereinafter with reference to the accompanying drawings, in which preferred embodiments of the invention are shown. This invention may be embodied in many different forms and should not be construed as limited to the embodiments set forth herein.

Overview

The present invention provides a method and apparatus for generating two frequencies for exciting resonance in a Cs atom. The method according to the present invention eliminates the need for power hungry RF-circuitry used in the prior art. By using the method and apparatus according to the present invention, it may be possible to reduce the atomic clock volume to 1 cm$^3$ and the power consumption to less than 30 mW. Although this method is described with reference to Cs atoms for exemplary purposes, it should be understood from the outset that this technique is equally applicable to other atomic species as well.

First Embodiment

Figure 1:
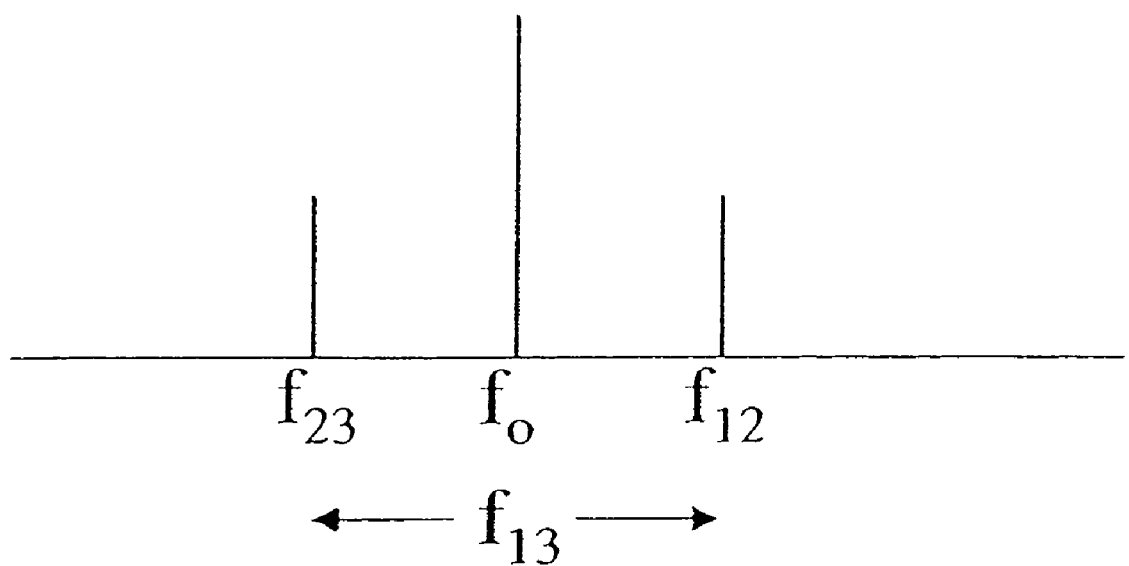
FIG. 1 shows a frequency output of the prior art approach.
Figure 2:
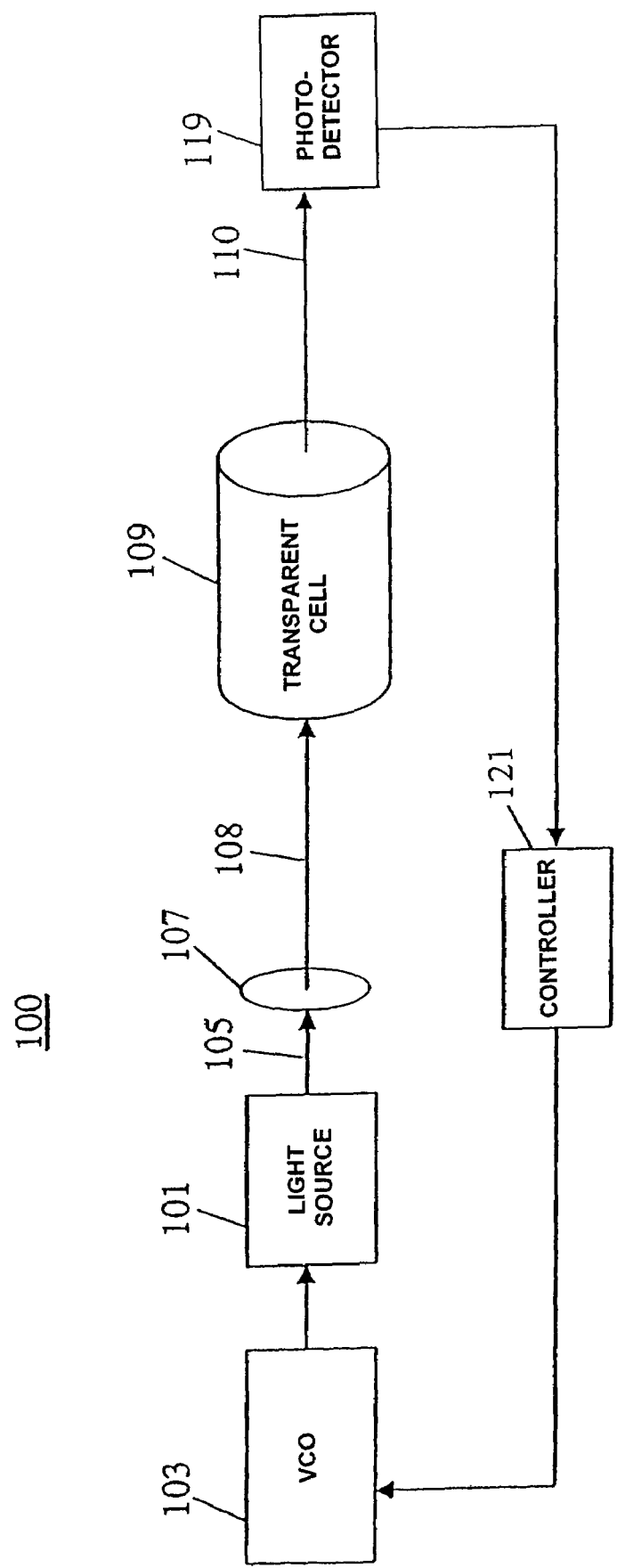
FIG. 2 shows the apparatus used according to the present invention.

The present invention according to a first embodiment provides a method and apparatus for generating two frequencies needed to excite resonance in a Cs atom. Although the frequency separation of the two frequencies is ideally within a factor better than $10^{-12}$ of the atomic hyperfine frequency of Cs, those skilled in the art will realize that $10^{-12}$ is only a matter of precision. Applications which do not require such a high degree of precision may have a greater tolerance for frequency separation deviation from the atomic hyperfine frequency of Cs. Shown in FIG. 2 is an apparatus 100 according to the present invention. The apparatus 100 comprises a coherent light source 101 such as a laser diode. The light source 101 is frequency modulated by a voltage controlled oscillator 103 (VCO) with a 200 MHz sinusoidal modulation signal for exemplary purposes only. In response, the light source 101 produces a lightwave 105 having a center frequency of approximately 335.345 THz and a plurality of sidebands shown in FIG. 3.

There are a variety of techniques for modulating the frequency of a laser diode. One technique is to simply change the drive current of the laser diode. A typical diode laser operating at a nominal drive current of 50 milliamperes has a 150–300 MHz frequency shift per milliamp of drive current. This approach is the easiest to implement but also produces a large amount of amplitude modulation.

A second approach incorporates a variable dielectric in a portion of the laser cavity. Changing the dielectric constant of this material changes the laser frequency without changing the amplitude of the emitted light. This approach is described in more detail in X. Huang, A. J. Seeds, J. S. Roberts, and A. P. Knight, "Monolithically Integrated Quantum-Confined Stark Effect Tuned Laser with Uniform Frequency Modulation Response," IEEE Photonics Technology Letters, Vol. 10, pp. 1697–1699 (1998). This second approach and all other techniques that allow one to vary the frequency of the emitted lightwave by the desired amount at the desired modulation frequency would also be suitable for this invention.

Figure 3:
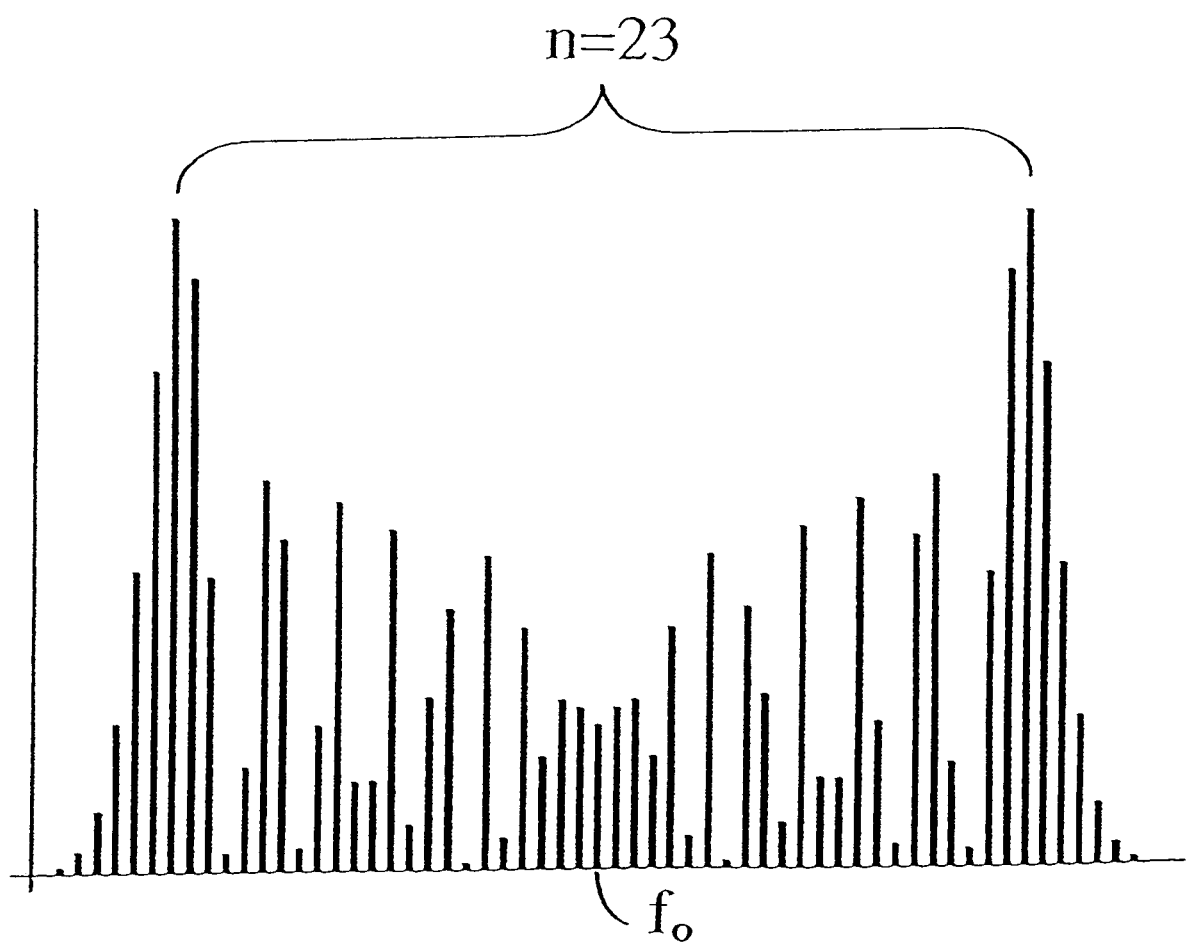
FIG. 3 shows the center frequency and the sidebands produced by the method according to a first embodiment of the present invention.

By frequency modulating the light source 101, the lightwave 105 contains a center frequency $f_o$ as well as a plurality of coherent optical fields, or sidebands, as shown in the exemplary graph of FIG. 3. The x-axis represents the frequency associated with each sideband, and the y-axis represents the energy associated with each sideband. Each sideband has a distinct frequency and is exactly separated from an adjacent sideband by the modulation frequency. The sidebands come in pairs, each pair having an upper sideband and a lower sideband. The absolute value of separation between the upper sideband and the center frequency, and the lower sideband and center frequency in a sideband pair is equal. The frequency of the upper sideband in a sideband pair is related by equation 1. The frequency of the lower sideband in a sideband is related by equation 2.

Upper sideband$_n$=center frequency+($n$×modulation frequency)    Equation 1

Lower sideband$_n$=center frequency−($n$×modulation frequency)    Equation 2

In equations 1 and 2, n corresponds to a specific sideband pair. For example, n=1 would correspond to the first pair of sidebands, which are the sidebands closest to the center frequency, and n=2 would correspond to the second pair of sidebands, etc. as shown in FIG. 3. The frequency separation between the upper sideband and lower sideband of a sideband pair is given by equation 3.

(2×$n$×modulation frequency)    Equation 3

From equation 3 and the exemplary modulation frequency of 200 MHz discussed above, it can be calculated algebraically that the frequency separation between the frequencies of the 23$^{rd}$ sideband pair is 9.2 GHz. These two frequencies will eventually be used to stimulate Cs atoms as further discussed below. Furthermore, it should be noted that these two frequencies have been generated with a 200 MHz signal, and not power hungry RF-circuitry.

Referring back to FIG. 2, the lightwave 105 passes through a quarter wave plate 107 to convert the lightwave 105 to a circularly polarized lightwave 108. The circularly polarized lightwave 108 is then directed through a transparent cell 109 containing an atomic gas (Cs for exemplary purposes only). The transparent cell 109 is equipped with Helmholtz coils (not shown) which provide a weak axial magnetic field that separates the degenerate atomic energy levels so that only certain transitions are excited. The transparent cell 109 is also equipped with one or more magnetic shields (not shown) which encase the Helmholtz coils and transparent cell 109 to prevent the Earth's magnetic field from changing the weak axial field. The transparent cell 109 may or may not have an added buffer gas to reduce the effects of wall collisions, but in all cases the cell 109 will be held at some fixed temperature above the melting point of the atomic species (30° C. for Cs), so that the Cs atoms are in the gaseous state, and so that collision-induced shifts in the atomic frequency are held constant. A more detailed description of the transparent cell 109 and its attendant components are described in J. Kitching, S. Knappe, N. Vukicevic, L. Hopllberg, R. Wynands, and W. Wiedmann, "A Microwave Frequency Reference based on VCSEL-Driven Dark Line Resonances in Cs Vapor," IEEE Trans. On Instruments and Measurements, Vol. 49, pp. 1313–1317 (2000).

Figure 4:
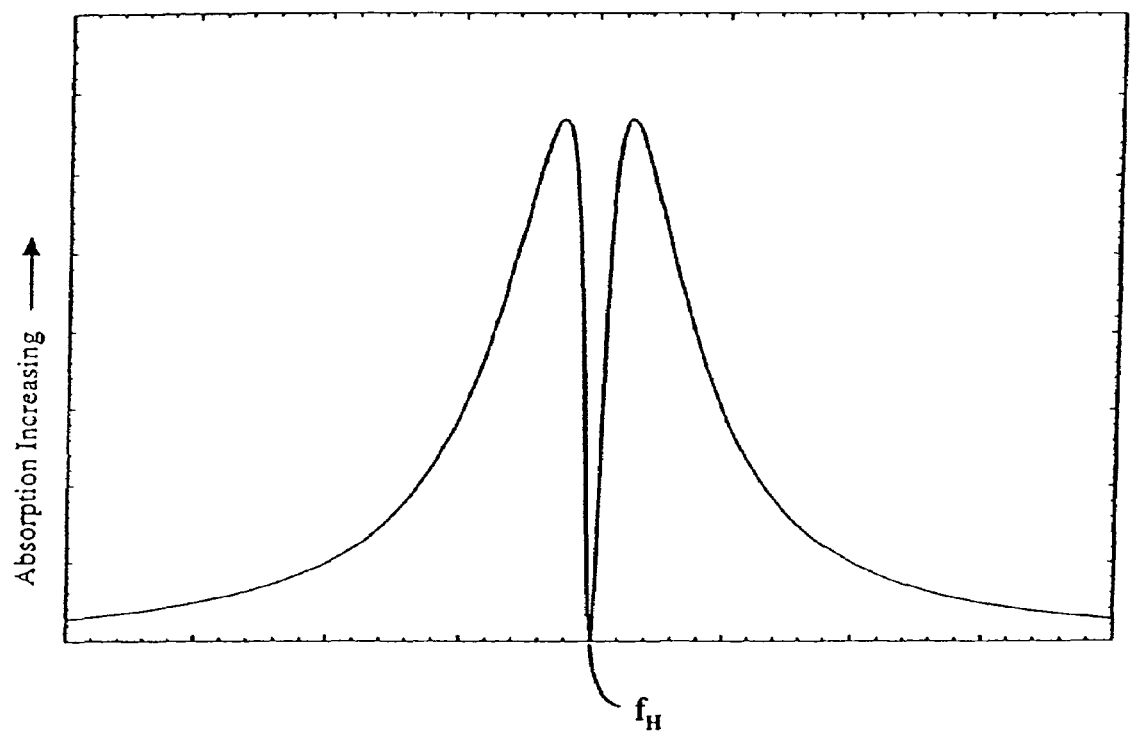
FIG. 4 shows how the absorption of energy changes for the Cs atoms as a function of the frequency separation between two frequencies.

When the circularly polarized lightwave 108 enters the transparent cell 109, the Cs atoms are excited. When the Cs atoms are excited they absorb energy from the circularly polarized lightwave 108. However, when the circularly polarized lightwave 108 contains two frequencies separated by the atomic frequency of Cs, the energy absorption by the Cs atoms will drop significantly due to the well-known dark-line resonance effect. Shown in FIG. 4 is an exemplary graph of how the energy absorption by the Cs atoms changes. The x-axis shows the absorption of the Cs atoms as the frequency separation changes between two frequencies.

The point $f_H$ corresponds to the absorption when the circularly polarized lightwave 108 contains the two frequencies needed to excite resonance in Cs atoms. The y-axis corresponds to the amount of energy absorbed for each frequency separation value. When the frequency separation is equal to the atomic hyperfine frequency, $f_H$, there is essentially no energy absorbed by the Cs atoms. The remaining frequencies are essentially filtered out by the Cs atoms, thereby generating a filtered lightwave 110, which only contains the two frequencies having a frequency separation equal to the atomic hyperfine frequency of Cs. The filtered lightwave 110 then exits the transparent cell 109 and is received by a photodetector 119.

The photodetector 119 has a photosensitive surface and is used to measure the intensity of the filtered lightwave 110 after the circularly polarized lightwave 108 has passed through the Cs atoms. Monitoring the change in intensity of the filtered lightwave 110 determines when the circularly polarized lightwave 108 contains two frequencies having the required hyperfine separation. The photodetector 119 converts the filtered lightwave 110 into a first electrical signal, which is coupled back to a controller 121. The controller 121, using a dithering technique, produces a second electrical signal which is used to adjust the voltage driving the voltage controlled oscillator 103, thereby adjusting the modulation frequency produced by the voltage controlled oscillator 103. Adjusting the modulation frequency will fine-tune the frequencies of the sidebands in the lightwave 105. By finely tuning the frequencies of the sidebands, it is possible to produce two frequencies that excite resonance in Cs, and as discussed above, the light transmitted through the Cs atoms will be at a maximum because no energy will be absorbed. From the discussion above, it can be calculated that a final modulation frequency of about 199.82 MHz will result in the two sidebands having frequencies separated by the atomic hyperfine frequency of Cs. Once the Cs atoms do not absorb any energy, the modulation frequency produced by the voltage controlled oscillator 103 at that moment is locked.

Figure 5:
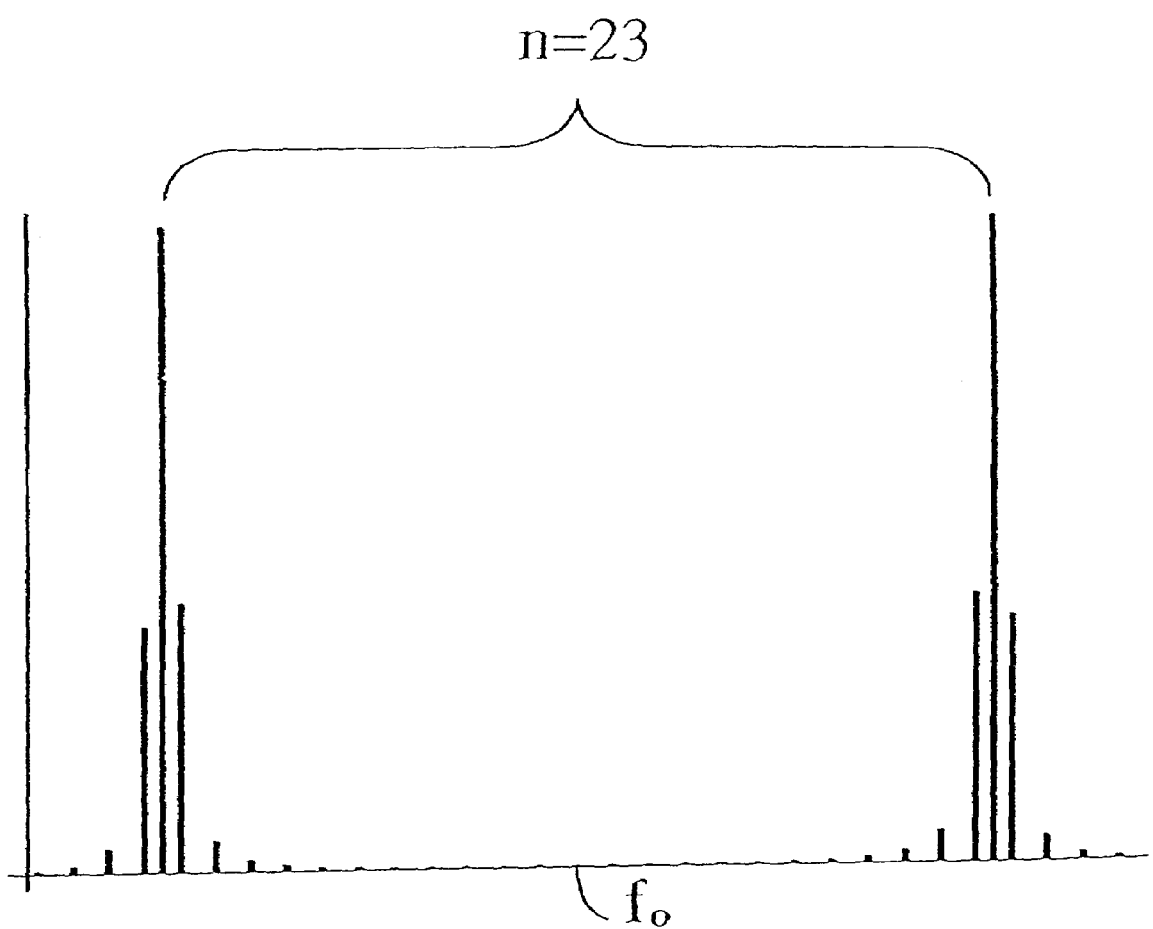
FIG. 5 shows the center frequency and the sidebands produced by the method according to an alternate embodiment of the present invention.

Alternatively, a square wave modulation signal can be used to localize a substantial portion of the energy in the lightwave 105 at the sidebands having a frequency separation equal to the atomic frequency of Cs. In such an approach, the voltage controlled oscillator 103 frequency modulates the light source 101 with a square wave modulation signal, at 200 MHz for exemplary purposes only, thereby emitting a lightwave 105 with a plurality of sidebands, as shown in FIG. 5. The x-axis represents the frequency of each sideband and the y-axis represents the energy of each sideband. The frequency of the square wave modulation signal can be adjusted to generate two frequencies having the desired separation, as previously discussed with reference to the sinusoidal modulation signal. As shown in FIG. 5, a substantial portion of the energy in the lightwave 105 is located around the $23^{rd}$ sideband pair. Using a square wave will put about 50% of the energy in the lightwave at the sideband pair of interest, in this case, the $23^{rd}$ sideband pair. Using the sine wave previously discussed will put approximately 10% of the energy in the lightwave at the sideband pair of interest. Adjusting which frequencies receive about 50% of the energy is a matter of adjusting the amplitude of the square wave modulation signal. Increasing the amplitude of the square wave modulation signal will push the energy in the lightwave 105 towards sidebands further away from the center frequency, and decreasing the amplitude will bring the energy in the lightwave 105 towards sidebands closer to the center frequency. In this way, the amplitude of the square wave can be adjusted, until about 50% of the energy in the lightwave 105 falls around the two frequencies separated by the atomic frequency of Cs.

Let it be understood that the foregoing description is only illustrative of the invention. Various alternatives and modifications can be devised by those skilled in the art without departing from the spirit of the invention. Accordingly, the present invention is intended to embrace all such alternatives, modifications, and variances which fall within the scope of the appended claims.

What is claimed is:

1. A method for exciting resonance in a plurality of atoms at an atomic frequency of the plurality of atoms, the method comprising the steps of:

frequency modulating a coherent light source with a modulation frequency whose n-th harmonic is said atomic frequency, with n being an integer substantially larger than two, to provide a lightwave, the lightwave having two coherent optical fields with a frequency separation substantially equal to the atomic frequency; and directing the lightwave at the plurality of atoms.

2. The method of claim 1, further comprising the step of changing the modulation frequency to adjust the frequency separation of the two coherent optical fields.

3. The method of claim 2, further comprising the step of locking the modulation frequency when the frequency separation of the two coherent optical fields is substantially equal to the atomic frequency.

4. The method of claim 1, wherein the step of frequency modulating comprises frequency modulating the coherent light source with a sine wave at the modulation frequency.

5. The method of claim 1, wherein the step of frequency modulating comprises frequency modulating the coherent light source with a square wave at the modulation frequency.

6. The method of claim 5, further comprising the step of adjusting the amplitude of the square wave, thereby localizing about 50% of the energy in the lightwave at the two coherent optical fields.

7. The method of claim 1, wherein the modulation frequency is provided without using up-converting hardware.

8. The method of claim 1, further comprising a step of locating a desired amount of energy in the lightwave at the two coherent optical fields.

9. The method of claim 8, wherein said desired amount of energy is a substantial portion of energy.

10. An apparatus for exciting resonance in a plurality of atoms at an atomic frequency of the plurality of atoms, the apparatus comprising:

a coherent light source that directs a lightwave at the plurality of atoms; and an oscillator that frequency modulates the coherent light source with a modulation frequency whose n-th harmonic is said atomic frequency, with n being an integer substantially larger than two, to generate the lightwave, wherein the lightwave contains two coherent optical fields having a frequency separation substantially equal to the atomic frequency.

11. The apparatus of claim 10, wherein the modulation frequency is changed to adjust the frequency separation of the two coherent optical fields.

12. The apparatus of claim 11, wherein the modulation frequency is locked when the frequency separation of the two coherent optical fields is substantially equal to the atomic frequency.

13. The apparatus of claim 10, wherein the oscillator frequency modulates the light source at the modulation frequency with a sine wave.

14. The apparatus of claim 10, wherein the oscillator frequency modulates the light source at the modulation frequency with a square wave.

15. The apparatus of claim 14, wherein the amplitude of the square wave is adjusted to localize about 50% of the energy in the lightwave at the two coherent optical fields.

16. The apparatus of claim 10, wherein the modulation frequency is provided without the use of up-converting hardware.

17. An apparatus for exciting resonance in a plurality of atoms at an atomic frequency of the plurality of atoms, the apparatus comprising:
   means for directing a lightwave at the plurality of atoms; and
   means for frequency modulating the means for directing a lightwave with a modulation frequency whose n-th harmonic is said atomic frequency, with n being an integer substantially larger than two, wherein the lightwave contains two coherent optical fields having a frequency separation substantially equal to the atomic frequency.

18. The apparatus of claim 17, wherein the modulation frequency is changed to adjust the frequency separation of the two coherent optical fields.

19. The apparatus of claim 18, wherein the modulation frequency is locked when the frequency separation of the two coherent optical fields is substantially equal to the atomic frequency.

20. The apparatus of claim 17, wherein the means for frequency modulating frequency modulates the means for directing a lightwave at the modulation frequency with a sine wave.

21. The apparatus of claim 17, wherein the means for frequency modulating frequency modulates the means for directing a lightwave at the modulation frequency with a square wave.

22. The apparatus of claim 21, wherein the amplitude of the square wave is adjusted to localize about 50% of the energy in the lightwave at the two coherent optical fields.

23. The apparatus of claim 17, wherein the modulation frequency is provided without the use of up-converting hardware.

* * * * *